(12) United States Patent
Enomoto et al.

(10) Patent No.: US 6,889,433 B1
(45) Date of Patent: May 10, 2005

(54) METHOD OF MANUFACTURING PRINTED-CIRCUIT BOARD

(75) Inventors: Ryo Enomoto, Motosu (JP); Takashi Kariya, Hashima-gun (JP); Hajime Sakamoto, Motosu (JP)

(73) Assignee: Ibiden Co., Ltd., Ogaki (JP)

( * ) Notice: Subject to any disclaimer, the term of this patent is extended or adjusted under 35 U.S.C. 154(b) by 26 days.

(21) Appl. No.: 10/030,428

(22) PCT Filed: Jul. 10, 2000

(86) PCT No.: PCT/JP00/04612

§ 371 (c)(1),
(2), (4) Date: Jan. 10, 2002

(87) PCT Pub. No.: WO01/05204

PCT Pub. Date: Jan. 18, 2001

(30) Foreign Application Priority Data

| Jul. 12, 1999 | (JP) | ................................. 11-198092 |
| Jul. 12, 1999 | (JP) | ................................. 11-198093 |
| Dec. 2, 1999 | (JP) | ................................. 11-343862 |
| Dec. 8, 1999 | (JP) | ................................. 11-348409 |
| Dec. 8, 1999 | (JP) | ................................. 11-348410 |
| Jan. 27, 2000 | (JP) | ............................... 2000-018171 |
| Jan. 27, 2000 | (JP) | ............................... 2000-018172 |
| Mar. 23, 2000 | (JP) | ............................... 2000-081391 |

(51) Int. Cl.$^7$ .............................................. H01K 3/10
(52) U.S. Cl. ............................. 29/852; 29/825; 29/846
(58) Field of Search ........................ 29/825, 846, 852, 29/829, 830, 847; 427/97.2, 97.7

(56) References Cited

U.S. PATENT DOCUMENTS

| 3,352,730 | A | * | 11/1967 | Murch, Jr. |
| 4,383,363 | A | * | 5/1983 | Hayakawa et al. |
| 4,763,403 | A | * | 8/1988 | Klein et al. |
| 5,481,795 | A | * | 1/1996 | Hatakeyama et al. |
| 5,759,669 | A | * | 6/1998 | Casey et al. |
| 5,939,789 | A | * | 8/1999 | Kawai et al. |
| 5,977,490 | A | * | 11/1999 | Kawakita et al. |
| 6,139,777 | A | * | 10/2000 | Omoya et al. |
| 6,211,487 | B1 | * | 4/2001 | Hatakeyama et al. |
| 6,240,636 | B1 | * | 6/2001 | Asai et al. |

FOREIGN PATENT DOCUMENTS

| EP | 0 568 930 | 11/1993 |
| EP | 0 645 951 | 3/1995 |
| EP | 0 851 724 | 7/1998 |
| JP | 6-262375 | 9/1994 |
| JP | 6-314876 | 11/1994 |
| JP | 9-162517 | 6/1997 |
| JP | 10-60319 | 3/1998 |

(Continued)

*Primary Examiner*—Carl J. Arbes
(74) *Attorney, Agent, or Firm*—Oblon, Spivak, McClelland, Maier & Neustadt, P.C.

(57) ABSTRACT

By filling a predetermined amount of conductive paste into an opening for forming a through hole or a VH formed in a resin insulating layer of a circuit board, and pressurizing the filled conductive paste under the condition of reduced pressure, removing air bubble strapped in the conductive paste.

8 Claims, 9 Drawing Sheets

FOREIGN PATENT DOCUMENTS

| | | |
|---|---|---|
| JP | 11-8471 | 1/1999 |
| JP | 11-20113 | 1/1999 |
| JP | 11-112144 | 4/1999 |
| JP | 11-214849 | 8/1999 |
| JP | 11-293091 | 10/1999 |
| JP | 11-307892 | 11/1999 |

* cited by examiner (A)

(B)

(C)

(D)

(E)

(A)

(B)

(C)

(D)

(E)

METHOD OF MANUFACTURING PRINTED-CIRCUIT BOARD

TECHNICAL FIELD

The invention relates to a method for manufacturing printed wiring boards (which may be referred to as "circuit boards" in the present specification), which method is particularly suitable for manufacturing multilayered printed-wiring boards.

BACKGROUND ART

In the manufacturing of circuit boards, the following methods have been generally used to fill electrically conductive paste into penetrations for through holes and openings for via holes (VH) in the circuit boards. First, conductive filler and resin particles are added to conductive metal particles, the resultant of which is mixed into solvent to make a mixture, and then the mixture is agitated into a conductive paste. Thereafter, a mask is placed on the penetration or opening positions, and then, from the top of the mask, the conductive paste is filled into the penetrations or openings with a squeegee by the method of printing. Alternatively, another method directly fills the conductive paste into the penetrations or openings with a dispenser.

In the filling of the paste by such methods, there has been a problem that air bubbles may be trapped into the conductive paste during the agitating or printing described above. This problem is remarkable in the filling of a highly-viscous conductive paste containing much conductive filler, then resulting in air bubbles remaining in the filled conductive paste. When the paste is cured in the state of still containing air bubbles, fears are in that the interlayer connection resistance may become unstable and/or water may be accumulated in the air bubbles. Particularly, if the paste retains moisture, there is the risk of a water vapor explosion under a high temperature atmosphere in reflow soldering process.

Further, the larger the amount of conductive filler contained in such conductive paste is, the higher the viscosity of the paste is. Therefore, when a highly viscous paste containing relatively large amount of conductive filler is filled into an opening, the resultant depression on the surface is small in depth. However, air is easily involved into the paste during kneading and filling, thereby resulting in a problem that air bubbles are easy to remain in the filled conductive paste. On the other hand, when a low viscous paste containing relatively small amount of conductive filler is filled into an opening, the involving of air into the paste during kneading and filling is reduced, but there is a problem that the resultant depression on the surface is large in depth. If air bubbles remain in the filled paste, they may contain moisture. In this case, after incorporated into electronic parts, the air bubble-containing paste may cause delamination in heat treatment such as reflow soldering, thereby resulting in degradation in connection resistance. Further, if the depression on the surface is large in depth, the filled conductive paste can not be sufficiently compressed during lamination press. That is, although the conductive paste is depressed downward by the thickness of the bump, the amount of depression is so small that the conductive filler can not closely contact with each other, thus easily causing a problem of degradation in connection resistance.

When a conductive paste in the center of VH's is also scraped off by a squeeze in the stage of squeezing treatment in printing and filling the conductive paste into the interior of the VH's, the problem concerning a depression in the surface can occur. Thereupon, when circuit boards are laminated to each other, the contact area between the conductive bump of this circuit board and a conductor circuit of a circuit board laminated on the top side of this circuit board can become small. Also, the bonding agent can be bit into between the conductive bump and the conductor circuit. Further, when the conductive paste contains volatile solvent components in large amount, the volume of the conductive paste reduces in the stage of pre-curing the conductive bump, thus causing a similar problem.

Also, conventional conductive pastes use liquid epoxy resins, as disclosed, for example, in Japanese Patent Laid-Open No. 10-60319. This is because the excellent flow property of material quality is preferred for filling a conductive paste into a small opening and, at the same time, the use of solvent is avoided to prevent air bubbles from entering the opening. After this conductive paste is filled into the opening in the circuit board, it is pre-cured to B stage, then proceeding to a next treatment process.

On the other hand, in the manufacturing of multilayer circuit board, for the purpose of making a connection between respective circuit boards, the conductive bumps are sometimes protruded from the circuit board. When the conductive bumps are made of a conductive paste, the conductive paste requires the following properties; (1) being in the state of moderate hardness when the conductive bumps have been formed by the conductive paste, (2) softening temperature thereof higher than that of an bonding-agent for bonding the respective circuit boards during hot-press, and (3) glass transition temperature thereof higher than 150° C., and the like.

However, because conventional conductive pastes do not satisfy the above properties, they can not be used for manufacturing the conductive bumps.

In response to the requirements of miniaturization, lighter weight, higher speed, and higher performance for recent electronic equipment, there is proposed a multilayer circuit board having an interstitial VH structure (hereinafter, sometimes abbreviated to IVH structure), which is easily adaptable to the higher density of wiring, instead of multilayer circuit boards having conventional through-hole structures. In the multilayer circuit board having this IVH structure, each interlayer insulating layer making up a laminated body is provided with a VH for making an electrical connection between conductor circuits. Such a circuit board is characterized in that an electrical connection between conductor circuit patterns in one layer and an electrical connection between a conductor circuit pattern in one layer and a conductor circuit pattern in another layer are made through a VH which does not pass through the wiring board (buried VH or blind VH). Therefore, the multilayer circuit board having such a IVH structure does not require a special area for forming a through hole, and thus each interlayer connection can be made by only a fine VH. Thus, it promises the easy realization of the miniaturization and higher density of electronic equipment and the high-speed propagation of signals.

However, in the manufacturing process of the multilayer circuit boards having the above-described IVH structure, there have been problems caused by an uncured resin used as an insulating resin substrate, such as glass epoxy preapreg obtained by impregnating glass fabric with a epoxy resin. That is, a plurality of circuit boards are formed by bonding copper foil to the preapreg with hot-press and etching the copper foil to form a conductor circuit, and then the plurality of circuit boards are laminated via a bonding agent. Thereafter, when the laminated circuit boards are hot-pressed at a time into a multilayered board, it has been observed that the shrinkage of the cured resin causes displacements of the positions of VH's in the X and Y directions. In order to deal with such displacements, the diameter of via lands has been required to be made large in advance, thereby making precision wiring difficult. Concerning this problem, the inventors proposed a single-sided circuit board or double-sided circuit board manufactured by using a resin substrate made up of a cured resin as a core material, instead of conventional insulating substrates made of uncured resins, and forming a conductor circuit or conductor circuits on a single side or both sides of the core material, and then making connections between the conductor circuits through filled VH's. Thus, the inventors provided a method for manufacturing a multilayer circuit board by conveniently combining and laminating a plurality of these boards and then hot-pressing the laminated boards at a time (Japanese Patent Application No. 10-179192).

However, this proposal has the following problem to be solved. That is, in the manufacturing of the double-sided circuit board, a through hole is formed in an insulating substrate, and a filled VH is formed by filling a conductive paste into the through hole by printing or the other methods. After that, copper foil is bonded to both sides of the substrate and the copper foil is etched, thereby forming conductor circuits on both sides.

However, when a multilayer circuit board is manufactured by laminating such double-sided circuit boards and single-sided circuit boards, the double-sided circuit boards and single-sided circuit boards must be manufactured in separate manufacturing lines. Therefore, there remains a realistic problem of the increased cost of manufacturing of the multilayer circuit board.

DISCLOSURE OF THE INVENTION

The first invention to overcome the above-described problem provides a method in which, after a predetermined amount of conductive paste is filled into an opening extending from one side of an insulating substrate to a conductor circuit, the conductive paste is pressurized under the condition of reduced pressure.

The second invention provides a method in which in filling a conductive paste into the opening, a first conductive layer is first formed by injecting a predetermined amount of a conductive paste of low viscosity, and then a second conductive layer is formed by filling a conductive paste of high viscosity, stacking over the first layer.

The third invention provides a method in which a conductive bump, formed after curing the conductive paste, can be made non-concave in the surface side to make contact with another printed wiring board.

The fourth invention provides a method which comprises, in forming a conductive bump, in a state where a protective film has been bonded to one side of an insulating substrate, applying laser beam to the protective film from above it to form an opening, filling a conductive paste into the opening, thereafter, peeling the protective film to expose the conductive paste, forming a resin bonding-agent layer in the half-cured state on one side of the insulating substrate, heating and press-bonding copper foil via the resin bonding-agent layer to make an electrical connection between the conductive paste and the copper foil, and after that, etching the copper foil to form conductor circuits on both sides of the insulating substrate.

Further, as a modification of this invention, there is provided a method characterized in that, for forming a circuit board having a conductor circuit on one side of the hard insulating substrate and having a filled VH extending to the conductor circuit formed through this insulating substrate, the manufacturing steps of the circuit board comprises at least the following steps (1) to (3). That is, (1) a step for applying an etching treatment to an insulating substrate having copper foil bonded to one side thereof to form a conductor circuit, (2) a step for bonding a protective film to the other side of the insulating substrate and applying laser beam to the protective film from above it to form an unthrough hole extending to the conductor circuit, and (3) pressurizing a conductive paste with the insulating substrate placed under the condition of reduced pressure, while filling the conductive paste into the unthrough hole or after filling, thus forming a filled VH making an electrical connection between the copper foil and the conductive paste.

The fifth invention provides a method which comprises forming a resin bonding-agent layer in the half-cured state on one side of an insulating substrate, making a protective film adhere to the resin bonding-agent layer, thereafter, applying laser beam to the protective film from above it to form an opening extending to a conductor circuit on the other side, filling a conductive paste into the opening, thereafter, peeling the protective film to expose the conductive paste, heating and press-bonding copper foil covering this conductive paste to make an electrical connection between the conductive paste and the copper foil, and thereafter, etching the copper foil to form conductor circuits on both sides of the insulating substrate.

The sixth invention provides a method for filling an opening with a conductive paste containing a conductive filler and a binder which is obtained by dissolving a thermosetting resin in the solid state at room temperature, into solvent.

Further, the first invention to the sixth invention described above can be implemented by a convenient combination of the first invention and one of the inventions from the second invention to the sixth invention, as described in claim 2 to claim 8. Also, one of the inventions from the second invention to the sixth invention can be implemented independently.

Also, (1) implementing of a convenient combination of the second invention and one of the inventions from the third invention to the sixth invention, (2) implementing of a combination of the third invention and one of the inventions from the fourth invention to the sixth invention, and (3) implementing a combination of the fourth invention and one of the fifth invention and the sixth invention are possible. Further, it is possible to implement an appropriate combination of the inventions of three to five kinds among the inventions from the first invention to the sixth invention. In addition, with respect to each combination described above, although not concretely described for avoiding complicated description, the inventions of arbitrary combinations could be implemented from the description of this specification by the skilled person in the art.

According to the first invention, it is characterized that not only the filling of a conductive paste into an opening, but also the eliminating of air bubbles trapped in the conductive paste can be performed by pressurizing the filled conductive paste with appropriate means under an appropriate reduced pressure.

As the above described conductive paste, a conductive paste comprising at least one kind of metal particle selected from among silver, copper, gold, nickel, and solder may be used. Also, metal particles having the surfaces coated with a different kind of metal may be used as the above-described metal particles. Concretely, copper particles having the surfaces coated with a noble metal selected from gold and silver may be used as the above metal particles.

As the above-described conductive paste, an organic-based conductive paste may be used also, in which paste an epoxy resin, a thermosetting resin such as a phenolic plastic, and a thermoplastic resin such as polyphenylene sulfide (PPS) are added to metal particles.

The filling of such conductive paste into an opening may be performed by any method of a printing method using a metal mask, the methods using a squeeze or a dispenser and the like. Further, the above condition of reduced pressure and the applied pressure may be determined depending on the viscosity of the conductive paste, an amount and kind of solvent, and the opening diameter and depth of a through hole or via hole. The pressurizing of the conductive paste under such an appropriate condition may be performed, for example, by a known press machine or vacuum laminator for forming dry-film.

Further, by heating the conductive paste filled in the opening to increase its fluidity, the time required to eliminate air bubbles may be decreased, as required.

The method of filling a conductive paste according to the present invention can be applied to the case of filling a conductive paste into a through hole. In this case, in the state in which one opening end of a through hole has been sealed, the conductive paste is filled into the through hole, and at the same, the filled conductive paste is pressurized by appropriate pressure-applying means under the condition of reduced pressure. After that, in the state in which the other opening end of the through hole has been sealed, the conductive paste is pressurized under the same condition of reduced pressure, thereby eliminating air bubbles.

Further, the method of filling conductive paste according to the present invention can be applied to the filling of a conductive paste not only into a through hole or an opening formed in a hard resin substrate, but also into a through hole or an opening formed in preapreg.

Also, the method of filling conductive paste according to the present invention can be effectively applied to the manufacturing of a single-sided circuit board for use in multilayer printed wiring boards that has a conductor circuit or conductor circuits on one side or both sides of an insulating substrate and has a via hole extending from one side of the insulating substrate to the other side having a conductor circuit formed thereon, a single-sided circuit board for use in multilayer printed wiring boards that has a conductor circuit or conductor circuits on one side or both sides of an insulating substrate and has a via hole extending from one side of the insulating substrate to the other side having a conductor circuit formed thereon and further has a protruding conductor directly above the via hole, and a multilayer printed wiring board formed by laminating these single-sided circuit board.

In the second invention, as a conductive paste of low viscosity which is difficult to keep the shape, the viscosity of the paste is preferably in the range from 0.1 Pa·s to 1.0 Pa·s. For example, the trade name XAE1244 from Tatsuta Electric Wire & Cable can be used. Also, as a conductive paste of high viscosity which is excellent in keeping the shape, the viscosity of the paste is preferably in the range from 1.0 Pa·s to 10.0 Pa·s. For example, the trade name TIB-12 from Asahi Chemical Research Laboratory may be used.

Here, the conductive paste of low viscosity refers to a paste of which viscosity is not higher than 1000 cps when measured at 5.0 rpm with E type viscometer, and the conductive paste of high viscosity refers to a paste of which viscosity is higher than 1000 cps.

Further, the second invention can be applied to the filling of conductive pastes into a through hole. In this case, either one of the conductive pastes of low viscosity and high viscosity is injected into the through hole by a desired amount in the state in which one end of opening has been sealed, and thereafter, the other of the conductive pastes is filled.

Also, in the second invention, in the interior of an opening extending from one side of an insulating substrate to a conductor circuit, a first conductive layer is formed by injecting a conductive paste of low viscosity so as to make electrical contact with the conductor circuit. At the same time, a second conductive layer is formed by filling a conductive paste of high viscosity stacking over the conductive paste of low viscosity such that part of the second conductive layer may be formed to function as a bump exposed from one side of the insulating substrate. Such a structure realizes very small variations in the heights of bumps and thus provides circuit boards that are excellent in the stability of connection. Further, the second invention can be effectively applied to the manufacturing of a circuit board having a conductor circuit or conductor circuits on one side or both sides of an insulating substrate and having a VH extending from one side of this insulating substrate to the other side provided with a conductor circuit, and a circuit board having a conductor circuit or conductor circuits on one side or both sides of an insulating substrate and having a VH extending from one side of this insulating substrate to the other side provided with a conductor circuit and further having a protruding conductor directly above the VH, and it can be also applied to the case where a multilayer circuit board is manufactured by laminating these circuit boards.

According to the second invention, by first injecting a predetermined amount of a conductive paste of low viscosity into an opening formed in a resin insulating layer and successively filling a conductive paste of high viscosity, stacking over the conductive paste of low viscosity, it is possible to prevent air bubbles from being trapped in the conductive paste and also to avoid a depression on the surface thereof. Therefore, this method can be applied to the manufacturing of circuit board, permitting the manufacturing of circuit boards having very small variations in the heights of bumps and the excellent stability of interlayer connection resistance.

In the third invention, the term "non-concave" refers to a plane or convex shape. Further, the protruding end side of a conductive bump can be made non-concave by the steps comprising, for example, (a) providing two separate peelable layers of peeling coatings adhering to one side of an insulating substrate in advance, (b) forming an opening extending from the surface of the peeling coatings to a conductor circuit, (c) filling the opening with a conductive paste and curing the paste to a moderate hardness, (d) peeling the upper part of the peeling coatings to expose a portion of the conductive paste (first peeling step), (e) pressing the exposed conductive paste, and (f) peeling the lower part of the peeling coatings (second peeling step). Then, as the peeling coating, a paper-made coating may be used, in addition to a resin-made coating such as polyethylene terephthalate (PET) and the like. Further, in the step (c), the curing of the conductive paste to a moderate hardness refers to the state in which the conductive paste is cured but has not been cured properly. Specifically, it refers to that the conductive paste exposed from the surface of the insulating substrate is cured not to be soft to such an extent that the conductive paste can be made flush with the insulating substrate by the press step (e).

According to the third invention, because the surface side on which the conductive bump makes contact with another circuit board is made non-concave, it is possible to ensure more excellent continuity to the circuit board of the opposed side even in laminating circuit boards. Further, because the moderately cured conductive paste is pressed, even if the conductive paste is made concave in the surface side on which the conductive bump makes contact with another circuit board, the press operation can make the non-concave surface flat or convex. Further, when cold-press is used for the pressing of the conductive paste, because the curing of the conductive paste can be restricted, it is easy to form a desired shape of the surface side on which the conductive bump makes contact with another circuit board.

According to the fourth invention, it is possible to manufacture not only a circuit board having circuits on both sides (hereinafter, sometimes referred to as "double-sided circuit board"), but also a circuit board having a circuit only on one side through the partially same steps as the double-sided circuit board, thereby permitting a reduction in the cost of manufacturing. Further, because the vacuum pressure degassing can be used to make a conductive paste fill a VH provided in an insulating substrate having copper foil (conductor circuit) bonded on its one side, it is possible to suppress air bubbles trapped in the conductive paste to a minimum, thus permitting the stable resistance of interlayer connection. Also, an insulating substrate used for the fourth invention is a hard insulating substrate made of properly cured resin materials, instead of conventional preapreg in the half-cured state. The use of such materials can eliminate press-pressure-caused variation in the final thickness of the insulating substrate when copper foil is press-bonded to the insulating substrate by hot-press. Thus, the displacement of VH's can be suppressed to a minimum, permitting small diameters of via lands. Therefore, a small pitch of wiring can be used to increase the density of wiring. Further, because the thickness of the substrates can be kept substantially constant, when a VH for forming a filled VH is formed by laser beam machining, the condition of laser beam application can be easily set.

In manufacturing the double-sided circuit board according to the fourth invention, protective films are first bonded to the surface having the above-described copper foil bonded and to the opposite surface of an insulating substrate, and laser beam is applied to the protective film from above it to form a VH. Also, in manufacturing a single-sided circuit board, after the copper foil is first etched to form a conductor circuit, protective films are bonded to the surface having the conductor circuit formed and to the opposite surface of the insulating substrate, and laser beam is applied to the protective film from above it to form a VH.

In manufacturing a single-sided circuit board, after filling of the conductive paste into the VH in the above insulating substrate, a filled VH is formed by peeling the protective film from the insulating substrate. Then, preferably, a resin bonding-agent in the half-cured state is formed over the conductive paste exposed at the surface of the insulating substrate.

Further, in manufacturing a double-sided circuit board, after filling of the conductive paste into a VH in the above insulating substrate, the protective film is peeled, and a resin bonding-agent in the half-cured state is formed covering the conductive paste exposed at the surface of the insulating substrate. Then, copper foil is hot-pressed to the surface of the insulating substrate via this resin bonding-agent, thereby electrically connecting the conductive paste and the copper foil. The resin bonding-agent is made of, for example, a bisphenol A type epoxy resin, preferably having a thickness in the range from 10 μm to 50 μm.

A circuit board having conductor circuits formed in this way on both sides of the insulating base substrate is suitable for a core substrate for forming a multilayer circuit board. This circuit board is an embodiment in which a via land (pad), formed as part of the conductor circuit on the substrate surface corresponding to each VH, has preferably a diameter in the range from 50 μm to 250 μm. Further, the single-sided circuit board is suitable for a circuit board for use in lamination, and the conductive paste filled in the VH is preferably formed into a protruding conductor that is exposed by a predetermined height from the surface of the board.

According to the fourth invention, a double-sided circuit board and a single-sided circuit board can be manufactured through manufacturing steps common in part, and thus it is possible to reduce the cost of manufacturing. Further, because vacuum pressure degassing can be used to make the conductive paste fill into a VH provided in the insulating substrate having copper foil bonded on one surface thereof, it is possible to suppress air bubbles to a minimum, and also the interlayer connection resistance can be made stable.

Further, according to the fifth invention, an insulating substrate is a hard insulating substrate made of properly cured resin material, instead of conventional preapreg in the half-cured state. Because the use of such material can eliminate press-pressure-caused variation in the final thickness of the insulating substrate when copper foil is press-bonded to the insulating substrate by hot-press, the displacements of VH's can be suppressed to a minimum, thus permitting a small via land. Therefore, a wiring pitch can be made small to increase the density of wiring. Further, because the thickness of the substrates can be kept substantially constant, when a VH for use in forming a filled VH is formed by laser beam machining, the condition of laser beam application can be easily set.

Copper foil is bonded via an appropriate bonding agent to one surface of the above-described insulating substrate, and is etched to form a conductor circuit. However, a single-sided copper-bonded laminated plate, in which copper foil has been bonded in advance to the insulating substrate, can be used instead of such bonding of copper foil to the insulating substrate.

In manufacturing the double-sided circuit board according to the fifth invention, protective films are first made adhere to the surface having the above-described copper foil bonded and the opposite surface of the insulating substrate, via resin bonding-agent layers in the half-cured state. Then, laser beam is applied to the protective film from above it to form a VH. In manufacturing a single-sided circuit board, the above copper foil is first etched to form a conductor circuit. After that, the protective films are made adhere to the surface having this circuit formed and the opposite surface of the insulating substrate, via a resin bonding-agent layer in the half-cured state. Then, laser beam is applied to the protective film from above it to form a VH.

In manufacturing a single-sided circuit board, after the filling of the conductive paste into a VH in the above-described insulating substrate, by peeling the protective film from the resin bonding-agent layer, the resin bonding-agent in the half-cured state is exposed at the surface of the insulating substrate. A circuit board having such conductor circuit formed on the insulating substrate is suitable for circuit boards for use in lamination, and the conductive paste filled into the VH is preferably exposed by a predetermined height to form a protruding conductor for use in a connection.

Further, in manufacturing a double-sided circuit board, after the filling of the conductive paste into a VH in the above-described insulating substrate, copper foil is bonded by hot-press via the resin bonding-agent layer remaining in the half-cured state on the insulating substrate.

According to the fifth invention, because double-sided circuit boards and single-sided circuit boards to be subjected to the manufacturing of a multilayer circuit board can be manufactured through manufacturing processes common in part, it is possible to reduce the cost of manufacturing. Further, because vacuum pressure degassing makes the conductive paste fill a VH provided in the insulating substrate having copper foil bonded on one side thereof, air bubbles remaining in the conductive paste can be suppressed to a minimum, thereby permitting the stabilization of interlayer connection resistance.

According to the sixth invention, because a conductive paste contains a thermosetting resin in the solid state at room temperature, it dries by pretreatment, for example, at about 100° C. due to volatilization of solvent (not reaching to B stage by a cure reaction of the resin), thus returning to the original solid state. As a result, the conductive paste is solid at room temperature, and particularly suitable material for manufacturing a conductive bump. Further, a conductive bump is selected to have softening temperature higher than that of the bonding agent bonding circuit boards to each other. Therefore, in the laminating and hot-pressing of a plurality of circuit boards, the conductive bump displaces the softened bonding agent and thereafter the bump itself becomes softened, thus causing conductive fillers to make close contact with each other. Thus, electrical resistivity can be reduced, permitting an excellent connection between the respective circuit boards.

In the above-described respective inventions from the first invention to the sixth invention, at least one kind of metal particles selected from among silver, copper, gold, nickel, and solder may be used for a conductive filler of the conductive paste. Further, metal particles coated with a different kind of metal may be used for the above metal particles. Specifically, copper particles coated with noble metal selected from gold and silver may be used. Further, binders containing an epoxy resin, a thermosetting resin such as a phenolic plastic, and a thermoplastic resin such as polyphenylene sulfide (PPS) may be used for the binder of the conductive paste.

The filling of such conductive paste into an opening can be performed by an arbitrary method including a method of printing with a metal mask and methods using a squeeze or a dispenser. Further, the above-described condition of reduced pressure and the applied pressure can be determined depending on the viscosity of the conductive paste, the kind and amount of the solvent, and the opening diameter and depth of a through hole and a VH. The pressurizing of the conductive paste under such an appropriate condition may be performed by a known press machine and a vacuum laminator for use in forming a dry-film. Further, as required, the conductive paste filled into an opening may be heated to increase the flow property, thereby permitting a reduction in the time for eliminating air bubbles. Also, the method for filling the conductive paste can be applied to the case of the filling of the conductive paste into a through hole. In this case, the conductive paste is filled into the through hole in the state in which one opening end of the through hole has been sealed. Then, at the same time, the filled conductive paste is pressurized by appropriate pressure-applying means under the condition of reduced pressure. After that, in the state in which the other opening end of the through hole has been sealed, the conductive paste is pressurized under the same condition of reduced pressure, thereby eliminating air bubbles. Further, the method can be applied to the filling of a conductive paste not only into a through hole or an opening formed in a hard resin substrate, but also into a through hole or an opening formed in preapreg.

Further, as the insulating substrate, a glass fabric epoxy substrate having a thickness of 20 $\mu$m to 600 $\mu$m is preferably used. This is because in a thickness less than 20 $\mu$m, the substrate is of so reduced strength that it is difficult to handle and further becomes low in reliability of electrical insulation, and in a thickness more than 600 $\mu$m, the forming of a fine VH and the filling of the conductive paste is difficult and the board itself is too thick. Copper foil is bonded to one surface of the insulating substrate via an appropriate bonding agent and etched to form a conductor circuit. A single-sided copper-bonded laminated plate, having copper foil bonded in advance on the insulating substrate, can be used instead of such bonding of copper foil to the insulating substrate.

Laser beam is applied to a glass epoxy substrate of the above thickness range to form a VH. Then, the VH is preferably formed by $CO_2$ laser beam applied under the conditions of pulse energy of 0.5 mJ to 100 mJ, pulse width of 1 $\mu$s to 100 $\mu$s, pulse spacing of not less than 0.5 ms, and the number of shots of 30 to 50. Further, the bore of the VH is preferably in the range from 50 $\mu$m to 250 $\mu$m, because in the case of less than 50 $\mu$m, the filling of the conductive paste into the VH is difficult, thus reducing the reliability of connection, and in the case of more than 250 $\mu$m, it makes higher density difficult.

Before filling the conductive paste into a VH, de-smear treatment is preferably performed to remove resin residues remaining on the inner wall of the VH in the light of ensuring connection reliability. Therein, for example, either of a dry de-smear treatment using plasma discharge or corona discharge, and a wet de-smear treatment using potassium permanganate solution and the like may be used. After the de-smear treatment on the VH in the above-described insulating substrate, a vacuum pressure degassing method is used to fill the VH with the conductive paste, which method is suitable for reducing the manufacturing cost and increasing the yield.

Further, the above-described plasma cleaning is preferably performed under the conditions of the output, degree of vacuum, reacting gas species, and energizing time such that the temperature of the circuit board may be kept below 60° C. The de-smear treatment by plasma cleaning can remove resin residues remaining in a VH without damaging the PET film and resin bonding-agent, which treatment is in synergy with the filling of the conductive paste by vacuum pressure degassing to permit interlayer connection resistance to be stabilized. For the plasma cleaning, the insulating substrate provided with a VH is placed on an electrode provided in the chamber of a known plasma cleaning apparatus, with the opening directed upward. Thus, the plasma cleaning is preferably performed with the electrode itself cooled such that the temperature of the bonding agent layer bonding copper foil to the insulating substrate and the temperature of the bonding agent layer and protective film bonded to the insulating substrate in the step of laser beam machining may be lower than the softening temperature of these resins. For this purpose, the conditions of the output, degree of vacuum, reacting gas species, and energizing time should be appropriately selected. By such treatment, resin residues can be plasma-cleaned and also it is possible to prevent the displacement of an opening and the peeling of the protective film caused by the softening of the resin bonding-agent. In this case, the insulating substrate is more advantageously placed on the electrode in the chamber via a heat-conductive sheet made of silicone resin containing metal particles, such that the substrate can more effectively dissipate the heat received thereby to the electrode.

Further, the thickness of the copper foil is desirably 3 μm to 18 μm and the hot-press is performed under appropriate temperature and applied pressure. The hot-press is more preferably performed under a condition of reduced pressure such that only the resin bonding-agent layer in the half-cured state may be cured, thereby permitting the copper foil to be strongly bonded to the insulating substrate. Thus, the manufacturing time can be reduced rather than that of the conventional circuit board using preapreg.

The copper foil bonded on one side of the insulating substrate is appropriately etched together with the copper foil bonded in advance to the other side of the insulating substrate as described above, thereby forming conductor circuits on both sides of the insulating substrate.

The protective film functions as a mask for printing when the conductive paste is filled into a VH extending from the surface of the insulating substrate to the copper foil. Thus, the protective film has an adhering agent layer that can be peeled from the insulating substrate after the VH is formed in the insulating substrate. Preferably, this protective film is made up of an adhering agent layer having a thickness of 1 μm to 20 μm and a PET film itself having a thickness of 10 μm to 50 μm, for example. This is because the protrusion height of the conductive paste from the surface of the insulating substrate is determined depending on the thickness of the PET film, and in a thickness less than 10 μm, the protrusion height is so small as to easily cause poor connections, and on the contrary, in a thickness more than 50 μm, the melted conductive paste spreads too much in the connection interface, thus making it impossible to form fine patterns.

Further, the above-described inventions can be effectively applied to the manufacturing of a circuit board having a conductor circuit or conductor circuits on one side or both sides of the insulating substrate and having a VH extending from one side of the insulating substrate to the other side having a conductor circuit formed thereon, and the manufacturing of a circuit board having a conductor circuit or conductor circuits on one side or both sides of the insulating substrate and having a VH extending from one side of the insulating substrate to the other side having a conductor circuit formed thereon and further having a protruding conductor directly above the VH, and the manufacturing of a multilayer circuit board formed by laminating these circuit boards.

BEST MODE FOR CARRYING OUT THE INVENTION (First embodiment)

Next, the first embodiment of the present invention will be described with reference to FIG. 1 to FIG. 4.

(Preparation of conductive paste)

As a conductive filler, 100 weight parts of flake-like silver having an average particle diameter of 10 μm were used. For a binder, 3.2 weight parts of a novolac epoxy resin having a molecular weight of 600 and 3.2 weight parts of a phenolic plastic having a molecular weight of 10000 to 15000 were used as thermosetting resins, and 6.8 weight parts of ethyl carbitol acetate were used as a solvent. The binder was prepared by mixing together the novolac resin and phenolic plastic, which are both solid at room temperature, and adding the ethyl carbitol acetate to dissolve the resins. The resultant matter obtained by adding and mixing silver to this binder was used as a conductive paste.

When conventional liquid epoxy resins of low molecular weight are subjected to pre-cure treatment, they start a cross-link reaction and reach B stage. However, when the conductive paste according to this embodiment is subjected to heat-drying treatment (for example, treated at 100° C. for 30 minutes), it is dried as a result of the volatilization of the solvent dissolving the resin, thus returning to a solid, which has the properties of the original resin. Also, the softening temperature in the solid state was above 60° C. Further, after cured at 180° C. for 70 minutes, the conductive paste has glass transition temperature higher than 150° C.

(1) The conductive filler is preferably particles of at least one kind of metal of gold, palladium, copper, nickel, tin, and lead, in addition to silver. Also, the average particle diameter of the metal particles is preferably from 0.5 μm to 20 μm.

(2) Also, as the thermosetting resin in the solid state at room temperature, for example, a novolac epoxy resin having a molecular weight not less than 400 can be used. In this case, a resin in the solid state at room temperature, for example, a phenolic plastic having a molecular weight not less than 10000 may be mixed to the novolac resin. In this case, the phenolic plastic is preferably of not more than 150 weight parts relative to the novolac resin of 100 weight parts.

(Manufacturing of a multilayer circuit board)

Next, a method for manufacturing a multilayer circuit board will be described, in which method a conductive bump is formed of the above conductive paste and establishes a connection between the circuit boards.

(1) Manufacturing of a double-sided circuit board for a core

Figure 1:
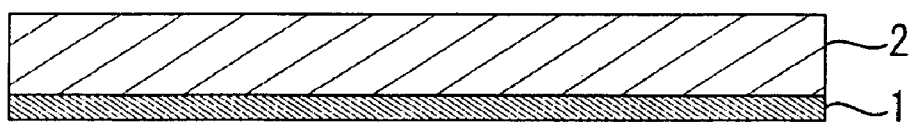
FIGS. 1(A) to (E) are cross-sectional views (1) showing a process for manufacturing a double-sided circuit board according to the first embodiment.
Figure 1:
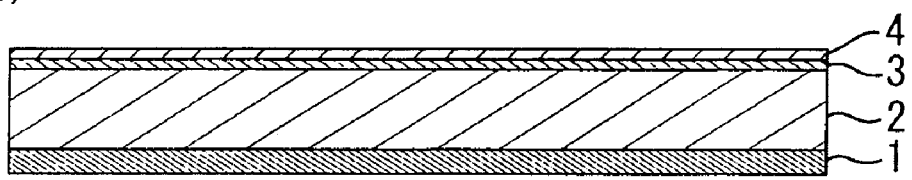
Figure 1:
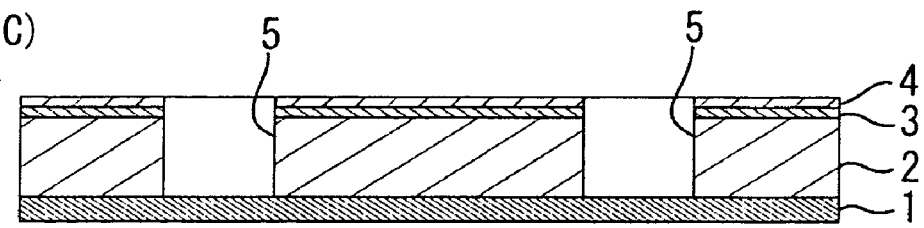
Figure 1:
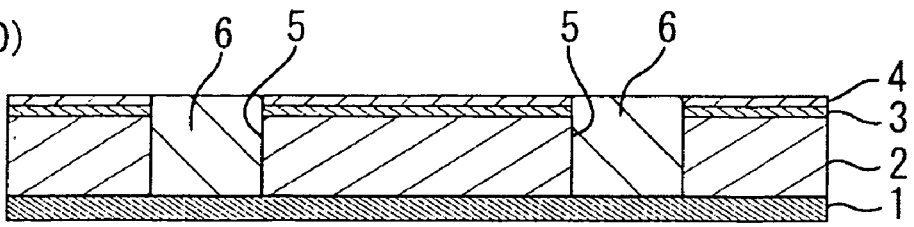
Figure 1:
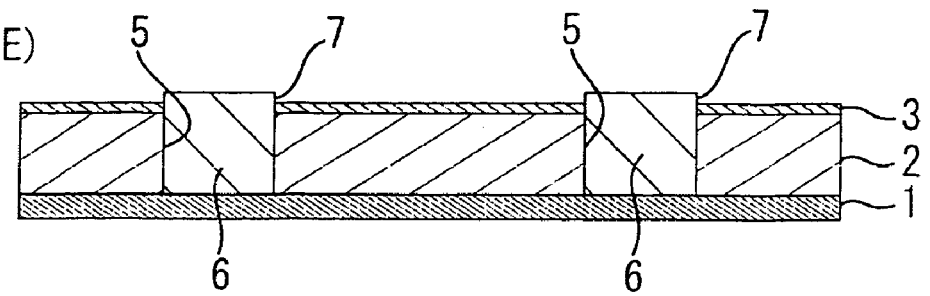
Figure 2:
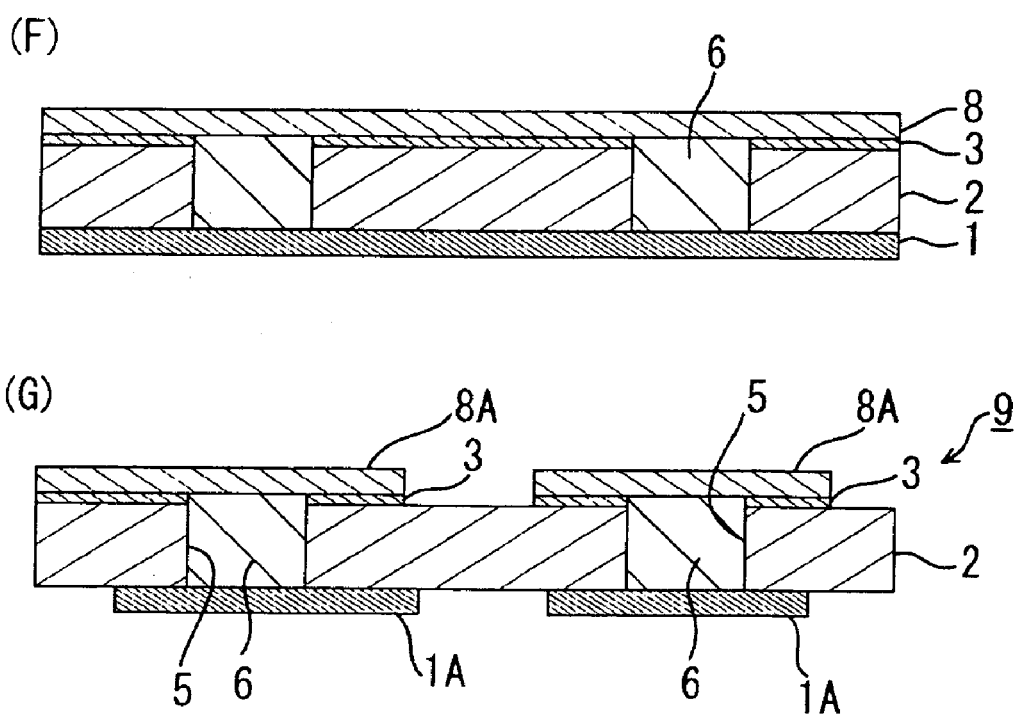
FIGS. 2(F) and (G) are cross-sectional views (2) showing a process for manufacturing a double-sided circuit board according to the first embodiment.
Figure 3:
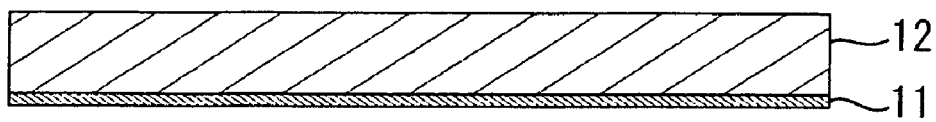
FIGS. 3(A) to (E) are cross-sectional views showing a process for manufacturing a single-sided circuit board according to the first embodiment.
Figure 3:
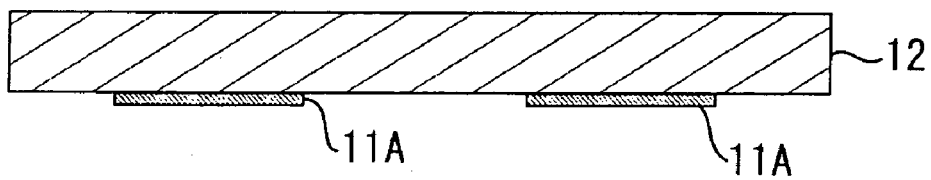
Figure 3:
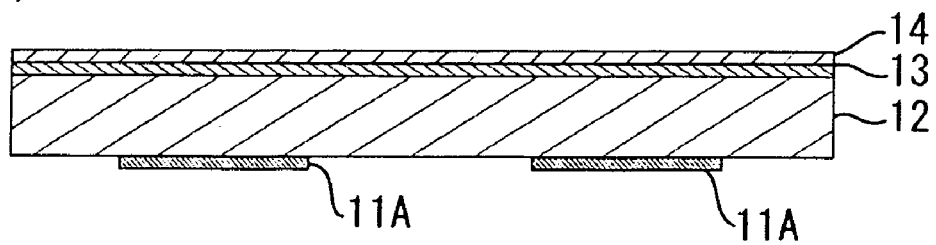
Figure 3:
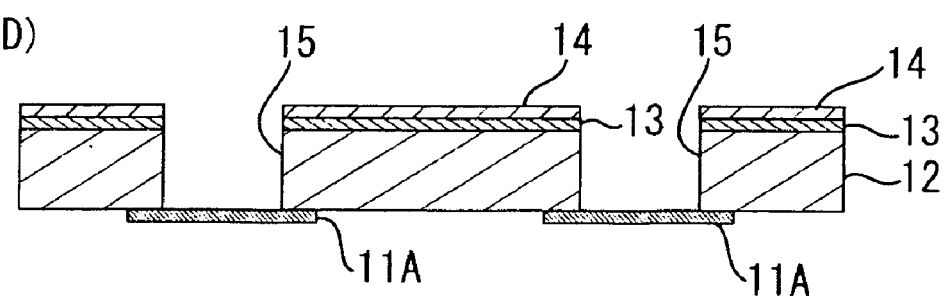
Figure 3:
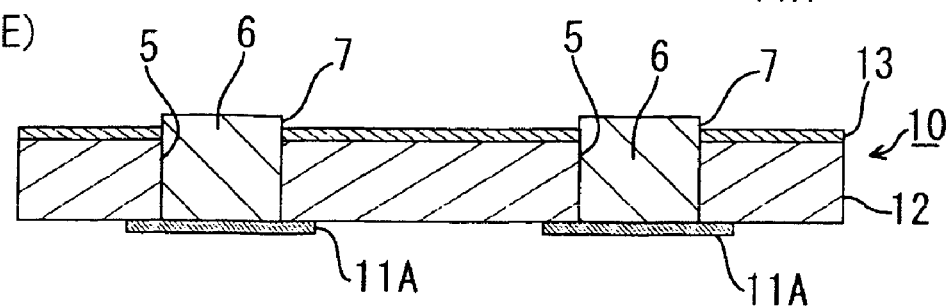

As shown in FIG. 1(A), an insulating substrate 2 having copper foil 1 bonded on one side thereof is used. As this insulating substrate 2, the following substrate can be used, for example. That is, a glass-fabric based epoxy resin substrate, glass-fabric based bismaleimide triazine resin substrate, glass-fabric based polyphenylene ether resin substrate, aramid nonwoven-fabric based epoxy resin substrate, aramide nonwoven-fabric based polyimide resin substrate. Also, preferably, the thickness of the insulating substrate 2 is 20 μm to 600 μm, and the thickness of the copper foil 1 is 3 μm to 18 μm. A single-sided copper-bonded laminated plate can preferably be used as the insulating substrate 2 and copper foil 1, wherein the single-sided copper-bonded laminated plate is obtained by laminating and then hot-pressing copper foil and preapreg which is made by impregnating glass fabric with particularly an epoxy resin and bringing the epoxy resin to B stage. With respect to such insulating substrate 2, as shown in FIG. 1(B), an bonding agent layer 3 in the half-cured state is provided on the surface side opposite to the surface side having the copper 1 bonded (upper surface side in FIG. 1). Further, a protective film 4 made of PET is bonded on the top of the bonding agent layer 3. Therein, epoxy resin varnish having softening temperature of the degree of about 60° C. may be used for the bonding agent layer 3, of which thickness is preferably is 10 μm to 50 μm. Also, although not illustrated in detail, the protective film 4 is a PET-made film of 10 μm to 50 μm thick, wherein an adhering agent layer of 1 μm to 20 μm thick is provided on one side of PET-made film.

Next, a VH 5 extending from the side of the protective film 4 bonded on the insulating substrate 2 to the copper foil 1 is formed, for example, by a $CO_2$ laser (FIG. 1(C)). Therein, the conditions of the $CO_2$ laser has desirably pulse energy of 0.5 mJ to 100 mJ, pulse width of 1 μs to 100 μs, pulse spacing of more than 0.5 ms, and the number of shot in the range from 3 to 50. Further, in order to remove resin residues from the inner wall of the VH 5, de-smear treatment is desirably performed.

Next, as shown in FIG. 1(D), a conductive paste 6 is filled into the VH 5 by printing method using a metal mask, methods using a squeeze or a dispenser and the like. After that, the whole substrate is placed under reduced pressure of $1 \times 10^3$ Pa to $5 \times 10^3$ Pa, and an appropriate press machine (not shown) pressurizes the surface of the conductive paste 6-exposed side of the insulating substrate 2 at 100° C. for about a few minutes. Then, the conductive paste 6 changes into a solid with moderate hardness due to the drying of solvent.

After that, on peeling off the protective film 4, the end portion of the conductive paste 6 filled in VH 5 is in the protruding state from the bonding agent layer 3 as a moderately cured conductive bump 7 (see FIG. 1(E)). Next, a copper foil 8 is hot-pressed (for example, $1.96 \times 10^{-2}$ Pa) to one side (upper side in FIG. 2) of the insulating substrate 2 via the bonding agent layer 3, for example at 180° C. for 70 minutes under reduced pressure (with vacuum of 20 Torr), thereby the copper foil being press-bonded thereto, and then the bonding agent layer 3 is cured (see FIG. 2(F)). Further, the surfaces of both copper foil 1 and 8 are subjected to etching treatment to form conductor circuits 1A and 8A (see FIG. 2(G)). Further, the surfaces of the conductor circuits 1A and 8A are desirably roughened using an etching solution made by MEC Company, for example. A double-sided circuit board 9 manufactured in this way is used as a core substrate. A single-sided circuit board 10 manufactured by a method described below can be laminated on the surface and back of the double-sided circuit board 9.

(2) Manufacturing of a single-sided circuit board

Different points from the above-described method of manufacturing a core substrate will be mainly described. As shown in FIG. 3(A), an insulating substrate 12 having copper foil 11 bonded on one side thereof is used. The surface of the copper foil 11 is subjected to an etching treatment to form a conductor circuit (FIG. 3(B)). Then, a bonding agent layer 13 in the half-cured state is provided and further a protective film 14 is bonded on the upper surface of the bonding agent layer 13 (see FIG. 3(C)). Next, a $CO_2$ laser is used to form a VH 15 extending to a conductor circuit 1A (see FIG. 3(D)). Then, the conductive paste 6 of the present invention is filled into the VH 15, and thereafter the whole substrate is placed under reduced pressure of $1 \times 10^3$ Pa to $5 \times 10^3$ Pa, and then an appropriate press machine (not shown) pressurizes the surface of the conductive paste 6-exposed side of the insulating substrate 12, for example, at 100° C. for about a few minutes.

After that, on peeling the protective film 14, the end portion of the conductive paste 6 filled in the VH 15 is in protruding state from the bonding agent layer 13 as a moderately cured conductive bump 7 (see FIG. 3(E)).

(3) Manufacturing of a multilayer circuit board

Figure 4:
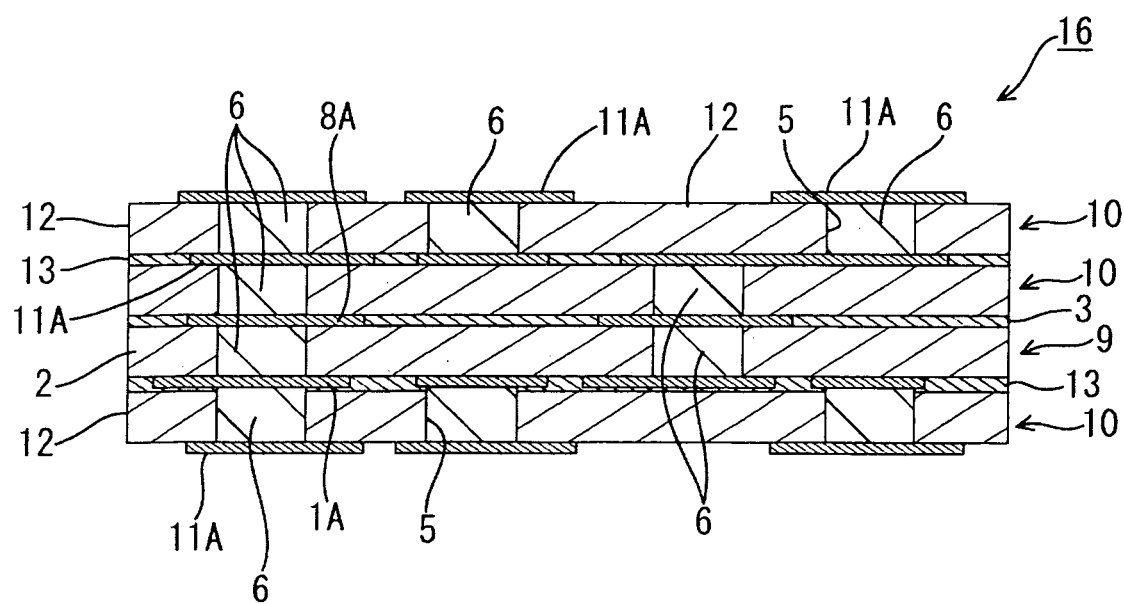
FIG. 4 is a cross-sectional view showing a multilayer circuit board according to the first embodiment.

Next, by laminating single-sided circuit boards 10 to both surface and back of the double-sided circuit board 9, a multilayer circuit board 16 is manufactured. FIG. 4 shows a cross-sectional view of a multilayer circuit board 16 of five layers, in which three single-sided circuit boards 10 are laminated to both sides of the double-sided circuit board 9 (to be more precise, one board in a lower layer and two boards in an upper layer). This multilayer circuit board 16 can be manufactured by a method that the circuit boards of the above five layers 9 and 10 are laminated and hot-pressed at 1 MPa to 5 MPa and 150° C. to 200° C.

According to the present embodiment, because the softening temperature of the conductive paste 6 is set higher than that of the bonding agent layers 3 and 13, the bonding agent layers 3 and 13 soften up with increasing temperature in hot-pressing, while the conductive paste 6 still remains solid. As the bonding agent layers 3 and 13 soften, it may be considered possible that the bonding agent flows into between the conductive bump 7 and the copper foil 8 or between the conductive bump 7 and the conductor circuits 1A and 8A. However, at that time, because the conductive bump 7 still retains moderate hardness, it can exclude the softened bonding agent layer 3 to make contact with the copper foil 8 or the conductor circuits 1A and 8A. After the contact, the conductive paste 7 itself also softens and brings the conductive fillers therein into contact with each other to permit reduction of electrical resistivity, thereby ensuring an excellent state of connection. Thus, according to the present embodiment, the conductive paste contains a thermosetting resin in the solid state at room temperature, so that the heat-drying treatment of the conductive paste changes it into a solid having moderate hardness by the drying of the solvent. Thus, the conductive paste according to the invention can be an excellent raw material for manufacturing the conductive bump.

Further, the conductive paste of the present invention may contain a curing agent generally used. Furthermore, various additives such as a dispersion stabilizer, plasticizer, skinning-preventing agent, and viscosity-controlling agent may be used for the conductive paste. Also, according to the embodiment, the conductive bump 7 is formed such that it may fill the interior of the VH's 5 and 15 and protrude from the surface of the circuit boards 9 and 10. However, according to the present invention, when at least two circuit boards are laminated together, it is sufficient that the conductive bump is situated between the layers to make an electrical connection between both circuit boards. Therefore, the conductive bump is not necessary to fill the interior of a through hole or VH in one of the circuit boards.

(Second embodiment)

In stead of the conductive paste 6 described in the first embodiment, two kinds of conductive pastes of low viscosity and of high viscosity can be used to fill the VH. Hereinafter, it will be described how this method is used to manufacture a multilayer wiring board. For example, as a low-viscosity conductive paste, a paste containing a filler of silver-plated copper particles and having a viscosity of 0.9 Pa·s is injected into an opening up to the height of 2/3 of a VH diameter, wherein the opening is for forming the VH and is formed by laser beam machining, such as the VH 5 shown in FIG. 1(C) or FIG. 3(D). Further, as a high-viscosity conductive paste, a paste containing a filler of silver-plated copper particles or silver particles and having a viscosity of 4 Pa·s is successively filled into the opening by using a metal mask having an opening diameter of 200 µm and a thickness of 100 µm, stacking over the low-viscosity conductive paste, thus forming VH. After that, this is followed by the procedures shown in FIG. 1 (D) or FIG. 3(E) and later figures.

(An example of modification)

Further, a similar circuit board can be manufactured by using a paste containing a silver-plated copper filler and having a viscosity of 0.7 Pa·s, as the low-viscosity conductive paste, and using a paste containing a silver-plated copper filler and a silver filler and having a viscosity of 3.0 Pa·s, as the high-viscosity conductive paste, for a paste filling the opening.

A paste containing a silver-plated copper filler and having viscosity of 0.7 Pa·s and a paste containing a silver-plated copper filler and having a viscosity of 3.5 Pa·s can be used respectively as a low-viscosity conductive paste and as a high-viscosity conductive paste to fill the opening, thereby permitting a similar circuit board.

According to the second embodiment or an example of its modification, it is possible to manufacture a circuit board in which no air bubble can be found and also each layer has bumps of a nearly constant height. Further, it is not always necessary for obtaining these advantages to combine the second embodiment or its modification with the first invention as described above.

(Third embodiment)

Figure 5:
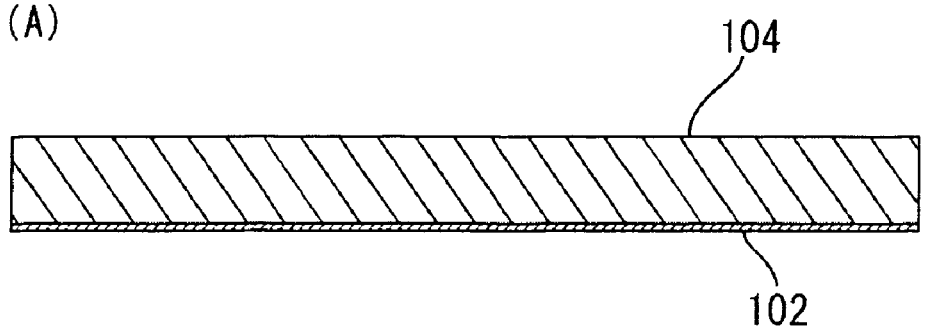
FIGS. 5(A) to (D) are diagrams (1) showing a method for manufacturing a circuit board having a conductive bump according to the third embodiment.
Figure 5:
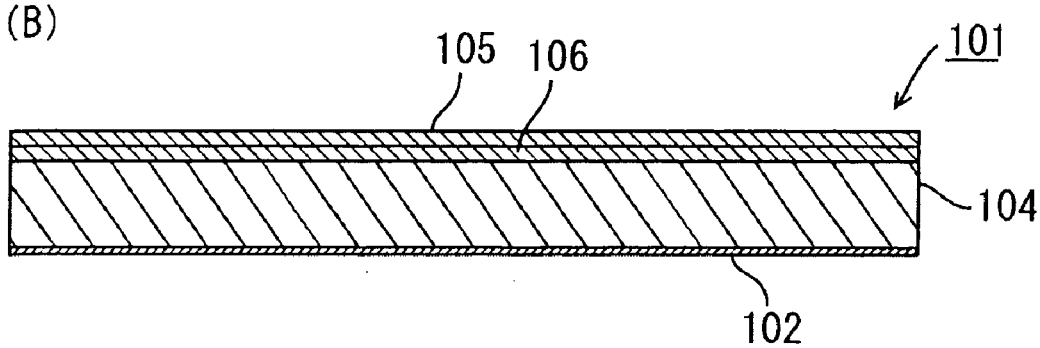
Figure 5:
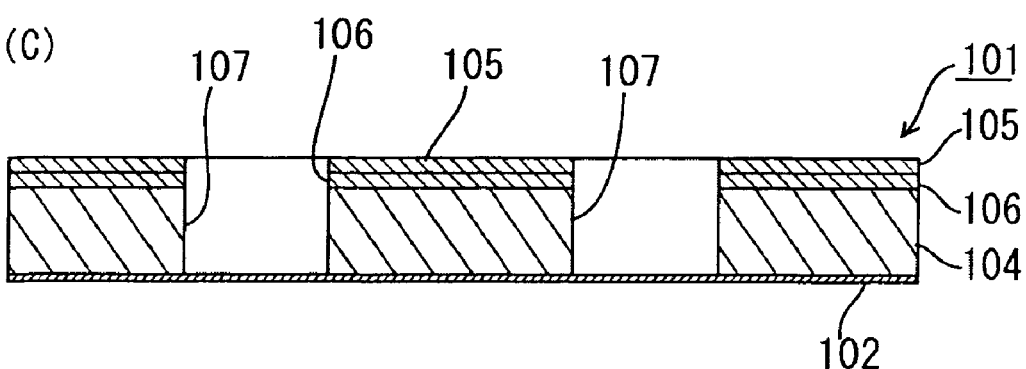
Figure 5:
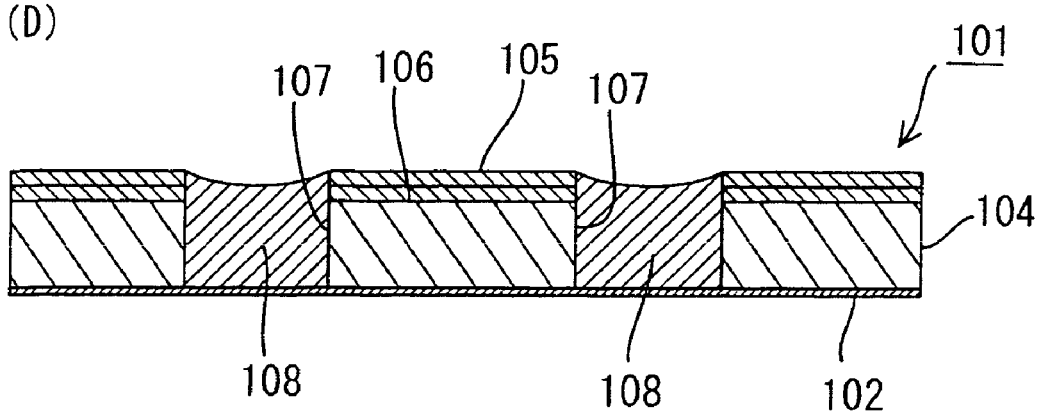
Figure 6:
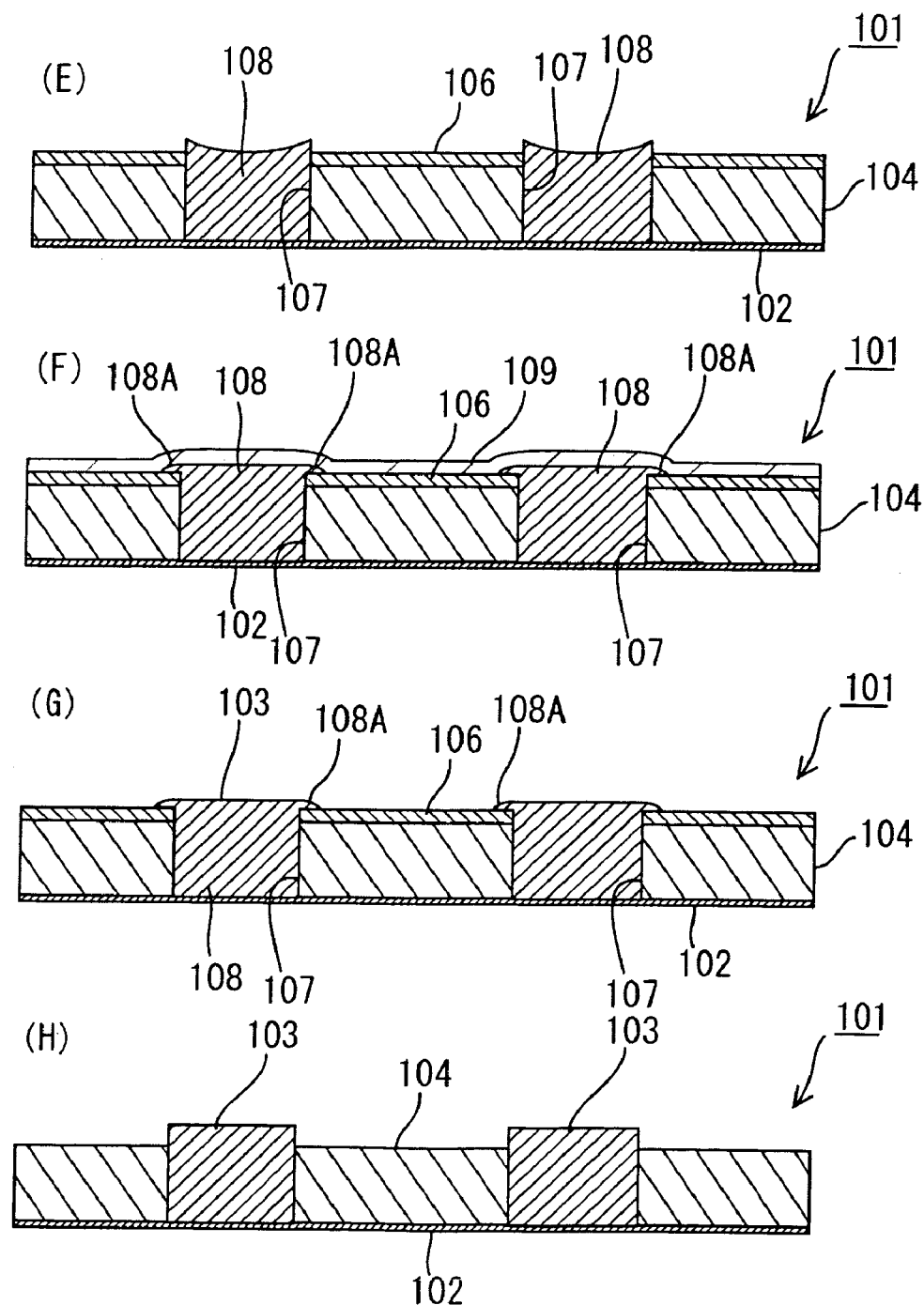
FIGS. 6(E) to (H) are diagrams (2) showing a method for manufacturing a circuit board having a conductive bump according to the third embodiment.

The third embodiment will be described with reference to FIG. 5 to FIG. 6.

Copper foil 102, for example, is provided on the whole underside of an insulating substrate 104 for forming a circuit board 101 (FIG. 5(A)). Further, after forming a conductive bump 103, this copper foil 102 is etched to form a conductor circuit. As shown in FIG. 5(B), two sheets of peeling coatings 105 and 106 are bonded on the upper surface of this insulating substrate 104 (by the way, hereinafter, a peeling coating of the upper side 105 is referred to as a first peeling coating 105 and a peeling coating of the lower side 106 is referred to as a second peeling coating 106). Both peeling coatings 105 and 106 are made of PET. Although not shown in detail, the undersides of both peeling coatings 105 and 106 are provided with an adhering agent layer.

Next, a VH 107 is formed at a predetermined position by a $CO_2$ laser (FIG. 5(C)). The VH 107 passes through both peeling coatings 105 and 106, and makes an opening extending from the upper surface of the insulating substrate 104 to the copper foil 102.

Then, this VH 107 is filled with silver-based conductive paste 108 (FIG. 5(D)). This conductive paste 108, filled for example by screen-printing method using a metal mask, is some times made concave-like in its central portion by squeezing during production. In this state, the conductive paste 108 is subjected to a first heat treatment at 80° C. for 10 minutes such that it may be cured to the extent of a moderate hardness (this first heat treatment may be varied depending on the kind of the conductive paste 108 to be used). Depending on the amount of solvent contained in the conductive paste 108, the first heat treatment may make the conductive paste 108 concave-like in the central potion of the VH 107.

Next, as shown in FIG. 6(E), only the first peeling coating 105 is peeled (first peeling process). At this time, part of the conductive paste 108 is in the protruding state from the upper surface of the second peeling coating 106. Then, for example, a Teflon film is disposed, as a separation film 109, on the whole upper surface of the second peeling coating 106 including the protruded conductive paste 108, and cold-press is performed from the upper surface of the separation film 109. In this way, the provision of the separation film 109 can make the conductive bump 103 finished excellently. This cold-press processing presses and crushes the conductive paste 108 protruding toward the side of the upper surface of the second peeling coating 106, thereby making the upper surface side thereof non-concave-like as shown in FIG. 6(F) (wherein the upper surface side thereof is a surface making contact with another circuit board. Further, another circuit board is not shown in figure, but has the same structure as the circuit board 101, and has an electrically accessible structure, such as copper foil or a conductive bump, at the position to make contact with the conductive bump 103).

After press processing, the separation film 109 is peeled (FIG. 6(G)), and a second heat treatment is performed as it is, for example, at 100° C. for 30 minutes. The second heat treatment further cures the conductive paste 108, which is to have a predetermined hardness. Further, the conditions of the second heat treatment are preferably set at higher temperature and for longer time than the first heat treatment.

Finally, the second peeling coating 106 is peeled from the insulating substrate 104 (second peeling process), by which the circuit board 101 is formed having non-concave conductive bump 103 on its surface side to make contact with another circuit board (FIG. 6(H)). Therein, a portion of the conductive paste 108 (portion marked with 108A) jutting from the opening edge of the VH 107, which portion has been formed by the press processing described above, is removed together with the second peeling coating 106 by the second peeling process, because the conductive paste 108 is not sufficiently cured. In this circuit board 101, the upper surface side (surface side to make contact with another circuit board) of the conductive bump 103 is made non-concave. As a result, when the circuit board 101 is laminated, excellent continuity is ensured between the conductive bump 103 and the conductor circuit of the opposed circuit board.

Thus, according to the embodiment, the conductive paste 103 to be pressed has been moderately cured by the first heat treatment. Therefore, even if the upper surface side (surface side to make contact with another circuit board) of the conductive paste 108 has been made concave, it can be made flat or convex by press operation. Also, because the conductive paste 108 moderately cured during the first heat treatment is pressed by a cold-press, the curing of the conductive paste 108 can be controlled. Thus, it is easy to form a desired shape of the surface side where the conductive bump 103 makes contact with another circuit board. Further, in the embodiment described above, for convenience in description, it is assumed that the upper surface side of the circuit board 101 is a surface side to make contact with another circuit. However, according to the invention, the conductive bump may be protruded toward the underside of the circuit board. Further, the first invention can be used as means for curing the conductive paste 108 of FIG. 5(D) to a moderate hardness.

(Fourth embodiment)

Figure 7:
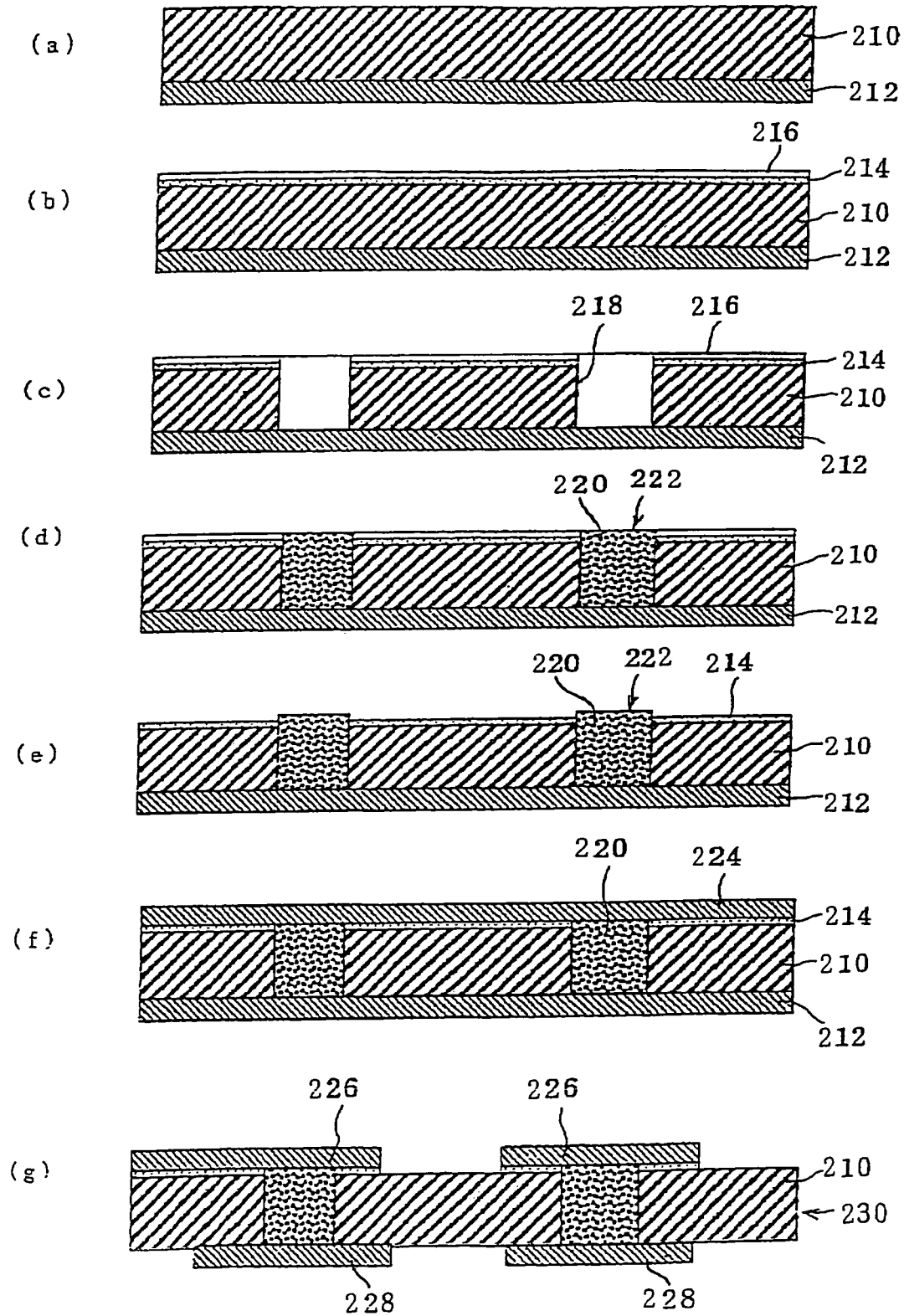
FIGS. 7(a) to (g) are diagrams showing a portion of a process for manufacturing a circuit board according to the fourth embodiment.
Figure 8:
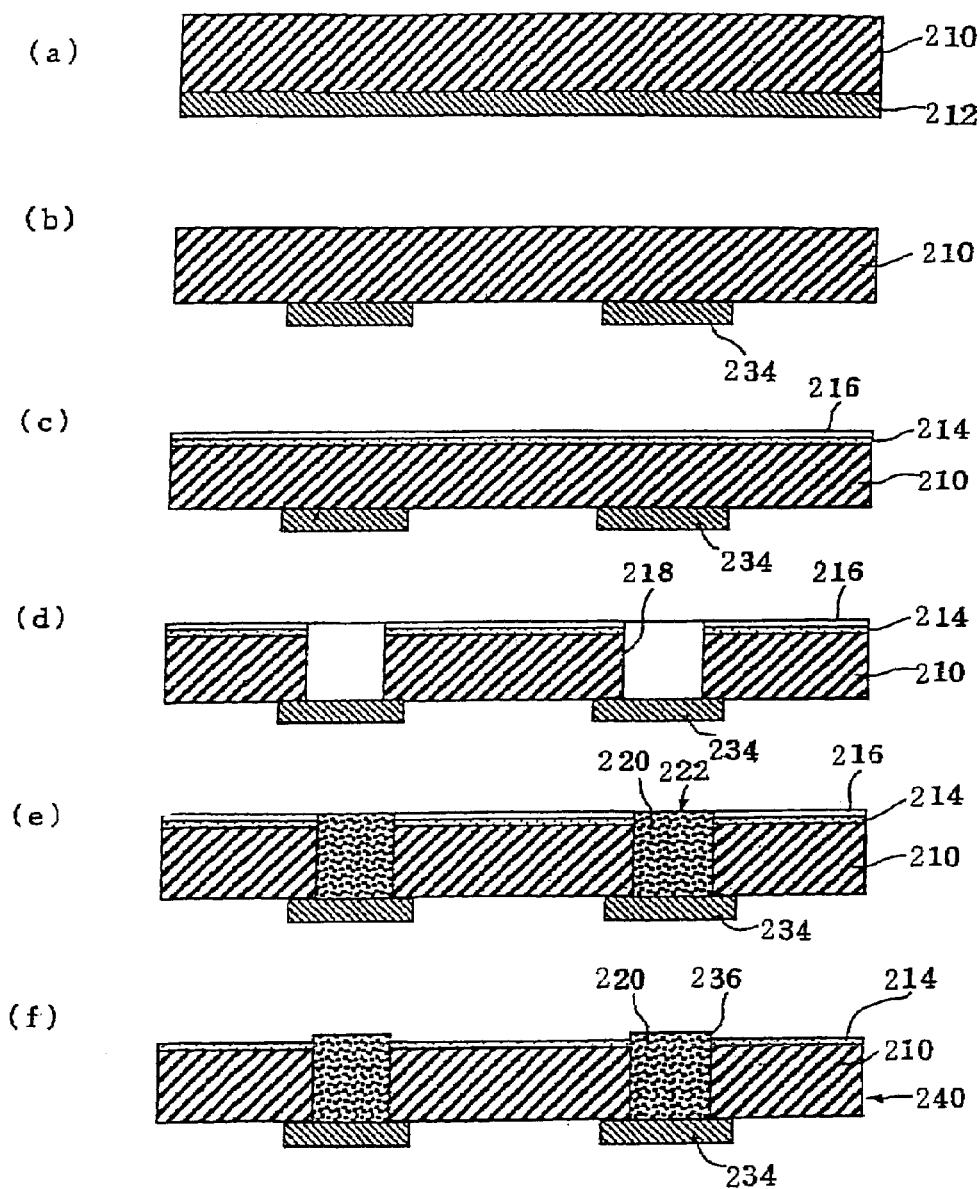
FIGS. 8(a) to (f) are diagrams showing a portion of a process for manufacturing a circuit board, which is stacked on a double-sided circuit board according to the fourth embodiment.

Hereinafter, an example of a method for manufacturing a double-sided circuit board for use in a mutilayer circuit board according to the present invention will be concretely described with reference to FIG. 7 to FIG. 9.

(1) In manufacturing a circuit plate for use in a multilayer circuit board according to the present invention, an insulating substrate 210 having copper foil 212 bonded on one side thereof is used as a start material (see FIG. 7(a)).

(2) A bonding agent in the half-cured state, i.e. a bonding agent layer of B stage 214 is provided on the copper 212-bonded surface and the opposite surface of such an insulating substrate 210. Further, a protective film 216 made of PET is bonded on the bonding agent layer 214 (see FIG. 7(b)). The bonding agent 214 is for bonding the copper foil forming a conductor circuit.

(3) Next, a $CO_2$ laser beam forms an unthrough hole 218 from above the protective film 216 bonded on the insulating substrate 210, which hole passes through the protective film 216 and the bonding agent layer 214 and extends to the copper foil 212 from the surface of the insulating substrate 210 (see FIG. 7(c)).

(4) In order to remove resin residues remaining on inner wall surface of the unthrough hole 218 formed in the step (3), de-smear treatment is performed using a method of plasma cleaning. At this time, in order to dissipate the heat received by the insulating substrate 210 to the electrode in the chamber, it is more advantageous that the insulating substrate 210 is placed on the electrode via a thermal conductivity sheet made up of silicon resin containing metal particles.

(5) Next, a conductive paste 220 is filled into the unthrough hole 218 which has been subjected to the de-smear treatment (see FIG. 7(d)). After that, the whole substrate is fixed on a stage in a vacuum chamber (not shown), and an appropriate press machine (not shown) pressurizes the surface of the exposed side of the conductive paste 220 in the insulating substrate 210 only for a few minutes under the reduced pressure of $1 \times 10^3$ to $5 \times 10^3$ Pa.

(6) Thereafter, after the protective film 216 is peeled from the surface of the bonding agent layer 214 (see FIG. 7(e)), copper foil 224 is press-bonded via the bonding agent layer 214 to one side of the insulating substrate 210 by hot-press. Then, the bonding agent layer 214 is cured (see FIG. 7(f)). At that time, the copper foil 224 is bonded to the insulating substrate 210 via the cured bonding agent layer 214 and thus the conductive paste 220 and the copper foil 224 are electrically connected.

(7) Then, etching protection films are respectively bonded on the copper foil 212 and 224 bonded on both sides of the insulating substrate 210 and covered with a mask of a predetermined circuit pattern. After that, etch processing is performed to form conductor circuits 226 and 228 (including via lands) (see FIG. 7(g)). In the step of this treatment, after a photosensitive dry film resist is first applied to the surfaces of the copper foil 212 and 224, exposure and development treatments are performed according to a predetermined circuit pattern to form a etching resist, and a metal layer in the etching resist-unformed portion is etched, thus forming conductor circuits 226 and 228 including a via land. As an etching solution, at least one kind of aqueous solution selected from among aqueous solutions of sulfuric acid-hydrogen peroxide, persulfate, cupric chloride, and ferrous chloride is desirable. In order to facilitate formation of fine patters, as pretreatment before forming the conductor circuits 226 and 228 by etching the above-described copper foil 212 and 224, the whole surface of the copper foil may be etched in advance to reduce its thickness to 1 μm to 10 μm, more preferably 2 μm to 8 μm. Although the inner diameter of the via lands of a part of the conductor circuit are nearly the same as the diameter of VH, but the outer diameter is preferably formed in the range from 50 μm to 250 μm.

(8) Next, a roughening treatment is performed on the surface of the conductor circuits 226 and 228 formed in the step (7) (roughened layer is not shown), thus forming a double-sided circuit board for use as a core 230. This roughening treatment is for improving adhesion of the bonding agent layer and preventing peeling (delamination), in laminating. A method of roughening treatment includes, for example, soft-etching treatment, blackening (oxidation)-deoxidation treatment, formation of needle alloy plating composed of copper-nickel-phosphorous (made by Ebara-Udylite; trade name Interplate), and surface roughening by the etching solution of trade name "MECetchBond" made by MEC company. In this embodiment, the above-described roughened layer is preferably formed with an etching solution. For example, the roughened layer may be formed by the etching treatment in which the surface of the conductor circuits is etched with an etching solution of mixed aqueous solution of cupric complex and organic acid. This etching solution can dissolve a copper conductor circuit under oxygen-coexisting conditions such as spraying and bubbling. Then, the following reaction is assumed to take place.

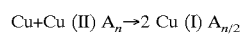

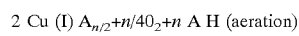

In this equation, A indicates a complexation agent (acting as a chelating agent), and n indicates a coordination number. As shown in this equation, a generated cuprous complex is dissolved by the action of acid and links together with oxygen into a cupric complex, thus contributing to the oxidation of copper again. A cupric complex used in the embodiment is preferably a cupric complex of azole group. This etching solution composed of organic acid —cupric complex can be prepared by dissolving a cupric complex of azole group and an organic acid (halogen ions as required) in water. Such an etching solution, for example, is made of an acqueous solution obtained by mixing imidazole cupric complex of 10 weight parts, glycolic acid of 7 weight parts and potassium chloride of 5 weight parts.

A double-sided circuit board is manufactured according to the above steps (1) to (8) and suitable for a circuit board for use as a core of a multilayer circuit board.

Next, a method for manufacturing single-sided circuit boards to be laminated respectively on the surface and back of this double-sided circuit board will be described with reference to FIG. 8.

(1) First, by bonding etching protective film on the copper foil 212 bonded on one side of the insulating substrate 210, covering the protective film with a mask of a predetermined circuit pattern, and thereafter performing an etching treatment, a conductor circuit 234 (including a via land) is formed (see FIG. 8(b)). In these treatment steps, after a photosensitive dry film resist is first applied to the surfaces of the copper foil 212, exposure and development treatments are performed according to a predetermined circuit pattern to form a etching resist, and a metal layer in etching resist-unformed portions is etched, thus forming a conductor circuit pattern 234 including a via land. As an etching solution, at least one kind of aqueous solution selected from among aqueous solutions of sulfuric acid-hydrogen peroxide, persulfate, cupric chloride, and ferrous chloride is desirable. In order to facilitate formation of fine patters, as pretreatment before forming the conductor circuit 234 by etching the above-described copper foil 212, the etching of the whole surface of the copper foil may be in advance etched to reduce its thickness to 1 $\mu$m to 10 $\mu$m, more preferably 2 $\mu$m to 8 $\mu$m.

(2) After forming the conductor circuit 234 on one side of the insulating substrate 210, nearly the same treatments as in the steps from (2) to (5) for the above double-sided circuit board are performed (see FIG. 8(c) to FIG. 8(e)). After that, the protective film 216 is peeled from the surface of the bonding agent layer 214, by which the conductor circuit 234 is formed on one side of the insulating substrate and a single-sided circuit board 240 is manufactured having a filled VH 222 electrically connected with the conductor circuit 234 (see FIG. 8(f)). In the state where the above-described protective film 216 has been peeled, the conductive paste 220 filling the unthrough hole 218 protrudes from the surface of the insulating substrate 210 about by a height of the thickness of the bonding agent layer 214 plus the thickness of the protective film 216. The height of this protrusion portion 236 (hereinafter, referred to as "protruding conductor") is preferably in the range from 5 $\mu$m to 30 $\mu$m. This is because in the range of less than 5 $\mu$m, poor connection may be easily caused, and in the range of more than 30 $\mu$m, in addition to the high value of resistance, when the protruding conductor 236 is heat-deformed in the hot-press step, the extension of the conductor over the surface of the insulating substrate may be too large to form fine patterns.

Further, the protruding conductor 236 formed of the above-described conductive paste 220 is preferably in the pre-cured state. This is because the protruding conductor 236 is hard even in the half-cured state and the end thereof protrudes from the bonding agent layer 214, so that in the stage of the lamination press, the protruding conductor 236 can make electrical contact with a conductor circuit (conductor pad) on another circuit board to be laminated before softening of the bonding agent layer 214. Further, the increase of contact area resulting from deformation during hot-press can not only reduce continuity resistance, but also correct variations in the height of the protruding conductor 236. In this way, the single-sided circuit board 240 manufactured by the steps (1) and (2) has the conductor circuit 234 on one surface of the insulating substrate 210 and the protruding conductor 236 formed by a portion of the conductive paste exposed on the other surface. Thus, it is laminated on the core circuit board 230 that has been manufactured in advance, being multilayered.

Figure 9:
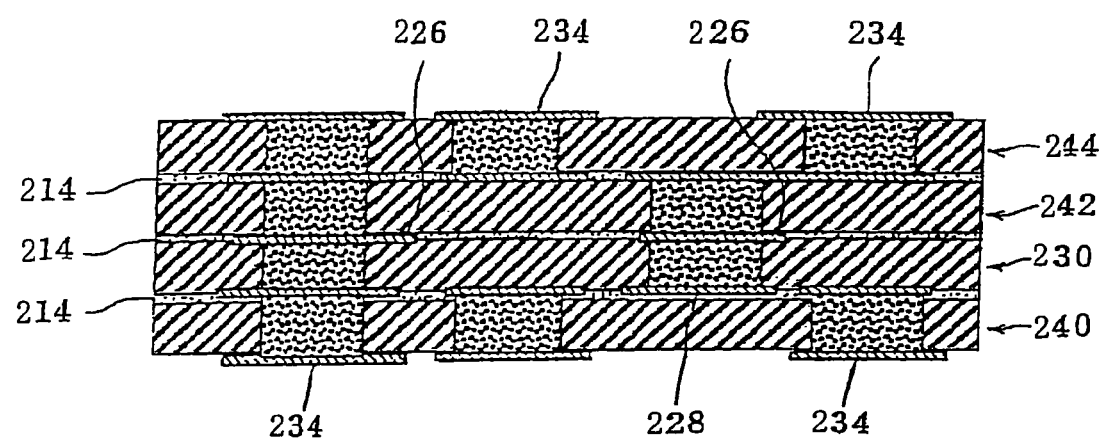
FIG. 9 is a diagram showing a four-layer wiring board manufactured by laminating a double-sided circuit board and single-sided circuit board together.

FIG. 9 shows a multilayer circuit board, in which three single-sided circuit boards 240, 242, and 244 are laminated on both sides of the core double-sided circuit board 230, forming four layer board. These four layer boards are press-formed in one piece at a time under the conditions of the heating temperature of 150° C. to 200° C. and the applied pressure of 1 MPa to 4 MPa. In this way, by heating and pressurizing at the same time, the bonding agent layer 238 in each of the single-sided circuit boards is cured and thus strong bonding can be done between adjacent single-sided circuit boards. Further, the use of a vacuum hot-press is suitable for the hot-press.

Further, instead of the bonding agent layer 238 formed in advance on the surface of the insulating substrate, an alternative bonding agent layer can be made as an uncured resin in the dried state by applying bonding agent on the whole surface of the protruding-conductor side and/or the whole surface of the conductor-circuit side of the insulating substrate, in the stage of lamination after each of single-sided circuit boards is manufactured. This bonding agent layer is preferably pre-cured for easy handling, of which thickness is desirably in the range from 5 $\mu$m to 50 $\mu$m. In the embodiment described above, the core double-sided circuit board and three layers of single-sided circuit boards are laminated into four layers, but the embodiment can be applied to the manufacturing of multilayer circuit boards having five layers or six layers and more.

As described above, according to the embodiment, because the double-sided circuit boards and single-sided circuit boards subjected to the manufacturing of a multilayer circuit board can be manufactured through manufacturing processes common in part, it is possible to reduce manufacturing cost. Further, because vacuum pressure degassing is used to fill a conductive paste into an unthrough hole provided in an insulating substrate having copper foil on one side thereof, air bubbles remaining in the conductive paste can be suppressed to a minimum, thus stabilizing connection resistance between layers. Furthermore, before filling the conductive paste into the unthrough hole, de-smear treatment by plasma cleaning is performed in the interior of the unthrough hole, it is possible to remove effectively resin residues remaining in the unthrough hole without causing damage to the protective film and resin bonding-agent. This acts in synergy with the filling of the conductive paste by vacuum pressure degassing, thus permitting more stabilized connection resistance between layers.

The technological range of the present invention should be not limited by each embodiment described above and can be implemented in various modifications. Further, the technological range of the present invention covers the range of equivalent.

INDUSTRIAL APPLICABILITY

According to the present invention, a method for manufacturing a printed wiring board ensuring an excellent connection between layers can be provided in constructing multilayer printed wiring boards.

What is claimed is:

1. A method for manufacturing a printed wiring board having a conductor circuit or conductor circuits on one side or both sides of an insulating substrate, and comprising a via hole which extends from one side of said insulating substrate to another side having the conductor circuit formed thereon, characterized by comprising the steps of:

(1) forming an opening extending from one side of said insulating substrate to the conductor circuit;

(2) filling a predetermined amount of conductive paste into said opening; and (3) pressurizing said conductive paste under a condition of reduced pressure.

2. The method for manufacturing a printed wiring board according to claim 1, characterized in that:

in said step (2), only a predetermined amount of a conductive paste of low viscosity is injected into said opening; and characterized by filling a conductive paste of high viscosity stacking over the injected conductive paste of low viscosity.

3. The method for manufacturing a printed wiring board according to claim 1, characterized in that a conductive bump formed by said conductive paste pressurized by said step (3) and protruding from one side of said insulating substrate is made non-concave in a surface side making contact with another printed wiring board.

4. The method for manufacturing a printed wiring board according to claim 1, wherein in said step (1), with a protective film bonded to one side of said insulating substrate, a laser beam is applied to the protective film from above it to form said opening, and characterized by comprising, after said step (3), the steps of:

(4) peeling said protective film to expose said conductive paste, forming a resin bonding-agent layer in a half-cured state on one side of said insulating substrate, and heating and press-bonding copper foil via the resin bonding-agent layer to establish an electrical connection between said conductive paste and said copper foil; and (5) etching said copper foil to form conductor circuits on both sides of said insulating substrate.

5. The method for manufacturing a printed wiring board according to claim 1, characterized in that in said step (1), after a resin bonding-agent layer is formed in a half-cured state on one side of said insulating substrate and a protective film is made adhere to the resin bonding-agent layer, a laser beam is applied to the protective film from above it to form an opening extending to said conductor circuit, and characterized by comprising, after said step (3), the steps of:

(6) peeling said protective film to expose said conductive paste, and heating and press-bonding copper foil over the conductive paste to establish an electrical connection between said conductive paste and said copper foil; and (7) etching said copper foil to form conductive circuits on both sides of said insulating substrate.

6. The method for manufacturing a printed wiring board according to claim 1, characterized in that said conductive paste of said step (2) contains a conductive filler and a binder obtained by dissolving a thermosetting resin in a solid state at room temperature into solvent.

7. The method for manufacturing a printed wiring board according to claim 1, characterized in that:

in said step (1), after a resin bonding-agent layer in a half-cured state is formed on one side of said insulating substrate and a protective film is made adhere to the resin bonding-agent layer, a laser beam is applied to the protective film from above it to form an opening extending to said conductor circuit; and in said step (2), a predetermined amount of a conductive paste of low viscosity is injected into said opening, stacking over the filled conductive paste of low viscosity, wherein the conductive paste of low viscosity contains a conductive filler and a binder obtained by dissolving a thermosetting resin in a solid state at room temperature into solvent, and the conductive paste of high viscosity contains a binder obtained by dissolving a conductive filler and a thermosetting resin in a solid state at room temperature into solvent; and a conductive bump formed by said conductive paste pressurized by said step (3) and protruding from one side of said insulating substrate is made non-concave in a surface side making contact with copper foil or another printed wiring board, and characterized by comprising thereafter a step of, peeling said protective film to expose said conductive paste, forming a resin bonding-agent layer in the half-cured state on one side of said insulating substrate, and heating and press-bonding said copper foil or another printed wiring board via the resin bonding-agent layer to establish an electrical connection between said conductive paste and said copper foil.

8. The method for manufacturing a printed wiring board according to claim 1, characterized in that:

in said step (1), with a protective film bonded to one side of said insulating substrate, a laser beam is applied to the protective film from above it to form said opening, in said step (2), a predetermined amount of a conductive paste of low viscosity is injected into said opening, stacking over the filled conductive paste of low viscosity, wherein the conductive paste of low viscosity contains a conductive filler and a binder obtained by dissolving a thermosetting resin in a solid state at room temperature into solvent, and the conductive paste of high viscosity contains a binder obtained by dissolving a conductive filler and a thermosetting resin in a solid state at room temperature into solvent, and a conductive bump formed by said conductive paste pressurized by said step (3) and protruding from one side of said insulating substrate is made non-concave in a surface side making contact with copper foil or another printed wiring board, and characterized by comprising thereafter a step of, (4) peeling said protective film to expose said conductive paste, and heating and press-bonding copper foil or another printed wiring board over the conductive paste to establish an electrical connection between said conductive paste and said copper foil.

* * * * *